United States Patent
Fukuda et al.

(10) Patent No.: US 8,859,138 B2
(45) Date of Patent: Oct. 14, 2014

(54) ELECTRICAL PART, NONAQUEOUS ELECTROLYTE CELL, AND LEAD WIRE AND SEALABLE CONTAINER WHICH ARE USED THEREIN

(75) Inventors: Yutaka Fukuda, Osaka (JP); Hiroshi Hayami, Osaka (JP); Hiroyasu Sugiyama, Kanuma (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 99 days.

(21) Appl. No.: 13/806,978

(22) PCT Filed: Jul. 20, 2011

(86) PCT No.: PCT/JP2011/066402
§ 371 (c)(1),
(2), (4) Date: Dec. 26, 2012

(87) PCT Pub. No.: WO2012/014737
PCT Pub. Date: Feb. 2, 2012

(65) Prior Publication Data
US 2013/0108915 A1 May 2, 2013

(30) Foreign Application Priority Data
Jul. 27, 2010 (JP) ................. 2010-167770

(51) Int. Cl.
| | | |
|---|---|---|
| H01M 2/04 | (2006.01) | |
| H01M 2/02 | (2006.01) | |
| H01G 9/10 | (2006.01) | |
| H01M 2/06 | (2006.01) | |
| H01M 2/08 | (2006.01) | |
| H01M 2/30 | (2006.01) | |
| C08L 39/02 | (2006.01) | |
| H01G 2/10 | (2006.01) | |
| H01G 4/224 | (2006.01) | |
| H05K 3/38 | (2006.01) | |

(52) U.S. Cl.
CPC .............. *H01M 2/08* (2013.01); *H01M 2/0212* (2013.01); *H01G 9/10* (2013.01); *H01M 2/06* (2013.01); *H01M 2/0287* (2013.01); *H01M 2/30* (2013.01); *H01M 2/021* (2013.01); *H01G 2/103* (2013.01); *H01G 4/224* (2013.01); *H05K 3/386* (2013.01); *C08L 39/02* (2013.01)
USPC ........................... 429/176; 429/179; 429/211

(58) Field of Classification Search
CPC .......... H01M 10/052; H01M 10/0525; H01M 2/0287; H01M 10/4235; H01M 2/08; H01M 2/021; H01M 2/30; H01M 2/06
USPC ......................... 429/164, 174, 176, 179, 211
See application file for complete search history.

(56) References Cited

U.S. PATENT DOCUMENTS

| | | | |
|---|---|---|---|
| 6,001,505 A | * | 12/1999 | Fukuda et al. ................ 429/176 |
| 2010/0015451 A1 | * | 1/2010 | Suzuta ....................... 428/424.8 |
| 2010/0140554 A1 | | 6/2010 | Oki et al. |

FOREIGN PATENT DOCUMENTS

EP          0969066 A2       1/2000

(Continued)

OTHER PUBLICATIONS

Extended European Search Report of the corresponding European Application No. 11812328.0, dated Apr. 17, 2014.

(Continued)

*Primary Examiner* — Stewart Fraser
(74) *Attorney, Agent, or Firm* — Global IP Counselors, LLP

(57) ABSTRACT

Provided are an electrical part, a nonaqueous electrolyte cell, and a lead wire and a sealable container which are used therein. The electrical part includes a sealable container having a metal layer, and a lead conductor extending from the inside to the outside of the sealable container, the sealable container and the lead conductor being fusion-bonded at a sealing portion, in which the sealing portion at least partially has a layer composed of a polyallylamine at a part between the metal layer and the lead conductor and in contact with the lead conductor, and therefore, adhesion and sealing properties can be enhanced in the initial state and in a state of being in contact with an electrolytic solution.

12 Claims, 4 Drawing Sheets

(56) References Cited

FOREIGN PATENT DOCUMENTS

| | | |
|---|---|---|
| EP | 0969066 A3 | 1/2000 |
| EP | 1976043 A1 | 10/2008 |
| EP | 2202823 A1 | 6/2010 |
| JP | 2001-266813 A | 9/2001 |
| JP | 2002-019021 A | 1/2002 |
| JP | 2002-226793 A | 8/2002 |
| JP | 3562129 B | 9/2004 |
| JP | 2009-099527 A | 5/2009 |
| JP | 2010-033888 A | 2/2010 |
| JP | 2010-102935 A | 5/2010 |
| KR | 10-2009-0018981 A | 2/2009 |

OTHER PUBLICATIONS

Notice of Allowance of the corresponding Korean Patent Application No. 2013-7001900, dated Mar. 31, 2014.

* cited by examiner

ELECTRICAL PART, NONAQUEOUS ELECTROLYTE CELL, AND LEAD WIRE AND SEALABLE CONTAINER WHICH ARE USED THEREIN

CROSS-REFERENCE TO RELATED APPLICATIONS

This U.S. National stage application claims priority under 35 U.S.C. §119(a) to Japanese Patent Application No. 2010-167770, filed in Japan on Jul. 27, 2010, the entire contents of which are hereby incorporated herein by reference.

TECHNICAL FIELD

The present invention relates to an electrical part and a nonaqueous electrolyte cell each used as an electric power supply for a small electronic device or the like, and also relates to a lead wire and a sealable container which are components thereof.

BACKGROUND ART

With reduction in size and weight of electronic devices, electrical parts used in electronic devices, such as cells and capacitors, have also been required to be reduced in size and weight. Consequently, for example, a nonaqueous electrolyte cell has been employed in which a bag body is used as a sealable container, and a nonaqueous electrolyte (electrolytic solution), a positive electrode, and a negative electrode are enclosed therein. As the nonaqueous electrolyte, an electrolytic solution prepared by dissolving a fluorine-containing lithium salt, such as $LiPF_6$ or $LiBF_4$, in propylene carbonate, ethylene carbonate, dimethyl carbonate, ethyl methyl carbonate, or the like is used.

Such a sealable container is required to have properties of preventing permeation of an electrolytic solution and gas therethrough and infiltration of moisture from the outside. Therefore, a laminate film including a metal layer, such as an aluminum foil, coated with a resin is used as a material for a sealable container. By fusion-bonding the edges of two laminate films, a sealable container is formed.

An opening portion is provided on one end of the sealable container, and a nonaqueous electrolyte, a positive electrode plate, a negative electrode plate, a separator, and the like are enclosed therein. Furthermore, a lead conductor having one end thereof connected to the positive electrode plate and a lead conductor having one end thereof connected to the negative electrode plate are arranged so as to extend from the inside to the outside of the sealable container. Lastly, by heat-sealing (fusion-bonding) the opening portion, the opening portion of the sealable container is closed, and the sealable container and each of the lead conductors are bonded together to seal the opening portion. The portion that is heat-sealed last is referred to as a sealing portion.

In this process, the sealable container and each of the lead conductors are bonded (fusion-bonded) together through a thermal adhesive layer. The thermal adhesive layer is provided in advance on a part of the lead conductor corresponding to the sealing portion, or provided in advance on a part of the sealable container corresponding to the sealing portion so that it can be interposed between the metal layer of the sealable container and the lead conductor. When the thermal adhesive layer has high fluidity at the time of heat-sealing, adhesiveness between the sealable container and the lead conductor can be enhanced. However, when fluidity is excessively high at the time of fusion-bonding, short-circuiting may occur between the metal layer and the lead conductor. Therefore, the sealing portion is required to have a characteristic of being capable of maintaining adhesion and sealing properties without causing short-circuiting between the metal layer and the lead conductor.

Japanese Patent No. 3562129 discloses a sealing bag for a battery and a lead wire which are used for such a nonaqueous electrolyte cell, and describes that the sealing property of a sealing portion can be enhanced by providing a maleic modified polyolefin layer, which serves as a thermal adhesive layer, directly on the conductor of a lead conductor.

CITATION LIST

Patent Literature

Technical Problem

In a sealing portion, adhesion and sealing properties between a sealable container and a lead conductor are required. Even when the adhesion property immediately after sealing is sufficient, the adhesiveness gradually decreases with time, resulting in occurrence of detachment at the interface with a metal layer or a lead conductor, which is a problem. The reason for this is that, as time passes, moisture permeates through the sealing portion, and the electrolyte enclosed in the sealable container reacts with water to produce hydrofluoric acid, resulting in corrosion of the lead conductor (metal). In particular, electrical parts in automobile applications need to be used for a long period of time, and it is required to further improve resistance to an electrolyte in fusion-bonding portions. In particular, detachment is likely to occur at the interface with nickel or a nickel plated layer used as a lead conductor for a negative electrode, and improvement in resistance to an electrolyte is desired.

In order to improve resistance to an electrolyte, Japanese Unexamined Patent Application Publication No. 2009-99527 discloses a battery tab in which a composite film layer composed of an aminated phenol polymer, a chromium [III] compound, and a phosphorus compound is formed on the surface and sides of a lead conductor having a nickel surface. It is stated that, by forming the composite film layer, the nickel layer is prevented from being corroded by hydrofluoric acid generated from the electrolyte and moisture, and the nickel layer is prevented from being dissolved. However, since chromium, which is a heavy metal, is used, this method is not environmentally desirable.

In consideration of the problems described above, it is an object of the present invention to provide an electrical part and a nonaqueous electrolyte cell, in which adhesion and sealing properties can be enhanced in the initial state and in a state of being in contact with an electrolytic solution, and also to provide a lead wire and a sealable container which are used therein.

SUMMARY OF THE INVENTION

The present invention provides an electrical part including a sealable container having a metal layer, and a lead conductor extending from the inside to the outside of the sealable container, the sealable container and the lead conductor being fusion-bonded at a sealing portion, characterized in that the sealing portion at least partially has a layer composed of a polyallylamine at a part between the metal layer and the lead conductor and in contact with the lead conductor (first invention of the present application). The sealable container and the lead conductor are fusion-bonded together through a thermal adhesive layer, and by further providing the layer composed of a polyallylamine at the part in contact with the lead conductor, resistance to an electrolyte is improved.

A polyallylamine is a polymer obtained by polymerizing at least one type of allylamine. When a polyallylamine having sulfur dioxide in its molecular structure, such as a copolymer of allylamine and sulfur dioxide, is used, adhesiveness to metal is improved, which is preferable (second invention of the present application).

Furthermore, when the polyallylamine includes diallylamine as a polymerizable component, corrosion prevention capability is improved, which is preferable (third invention of the present application). When diallylamine is included as a polymerizable component, a secondary or higher amine group exists in the polymer, and therefore, corrosion prevention capability is enhanced. In this case, a diallylamine polymer obtained by polymerizing diallylamine only may be used, or a diallylamine copolymer obtained by polymerizing diallylamine with another copolymerizable component may be used.

Furthermore, the present invention provides a nonaqueous electrolyte cell including a sealable container having a metal layer, a lead conductor extending from the inside to the outside of the sealable container, a nonaqueous electrolyte enclosed inside the sealable container, and an electrode enclosed inside the sealable container and connected to an end of the lead conductor, the sealable container and the lead conductor being fusion-bonded at a sealing portion, characterized in that the sealing portion at least partially has a layer composed of a polyallylamine at a part between the metal layer and the lead conductor and in contact with the lead conductor (fourth invention of the present application). In the nonaqueous electrolyte cell having such a structure, the sealing portion has high adhesion and sealing properties and high resistance to an electrolyte, and therefore, adhesion and sealing properties can be maintained even if used over a long period of time.

Furthermore, the present invention provides a lead wire to be used in the electrical part or the nonaqueous electrolyte cell, the lead wire including a lead conductor, a thermal adhesive layer which covers a part corresponding to at least the sealing portion of the lead conductor, and a layer composed of a polyallylamine provided between the thermal adhesive layer and the lead conductor (fifth invention of the present application).

The part corresponding to the sealing portion of the lead conductor is a part at which the lead conductor and the sealable container (metal layer) are bonded together. When one surface or both surfaces of the lead conductor corresponding to this part are covered with the thermal adhesive layer and the layer composed of a polyallylamine is provided between the thermal adhesive layer and the lead conductor, the layer composed of a polyallylamine comes into contact with the lead conductor. By using the lead wire having such a structure, it is possible to obtain an electrical part and a nonaqueous electrolyte cell in which the sealing portion has high adhesion and sealing properties, and adhesion and sealing properties can be maintained even if used over a long period of time. When the lead conductor is composed of nickel or a metal whose surface is plated with nickel, in particular, the effect of improving resistance to an electrolyte is increased (sixth invention of the present application).

Furthermore, the present invention provides a sealable container to be used in the electrical part or the nonaqueous electrolyte cell, the sealable container including a metal layer, a thermal adhesive layer which covers a part corresponding to at least the sealing portion of the metal layer, and a layer composed of a polyallylamine provided on a surface of the thermal adhesive layer at a part in contact with the lead conductor (seventh invention of the present application).

The part corresponding to the sealing portion of the metal layer is a part at which the lead conductor and the sealable container (metal layer) are bonded together. The sealable container is composed of a laminate film generally including a metal layer and a resin layer which covers the entire surface of the metal layer. A thermal adhesive layer may be provided on the surface of the resin layer at a part corresponding to the sealing portion, and a layer composed of a polyallylamine may be provided on the surface of the thermal adhesive layer. Alternatively, the resin may be entirely or partially replaced with a thermal adhesive layer, and a layer composed of a polyallylamine may be provided on the surface of the thermal adhesive layer at a part corresponding to the sealing portion. By using the sealable container having such a structure, it is possible to obtain an electrical part and a nonaqueous electrolyte cell in which the sealing portion has high adhesion and sealing properties, and adhesion and sealing properties can be maintained even if used over a long period of time.

Advantageous Effects of Invention

According to the present invention, it is possible to provide an electrical part and a nonaqueous electrolyte cell, in which adhesion and sealing properties can be enhanced in the initial state and in a state of being in contact with an electrolytic solution, and also to provide a lead wire and a sealable container which are used therein.

DETAILED DESCRIPTION

Figure 1:
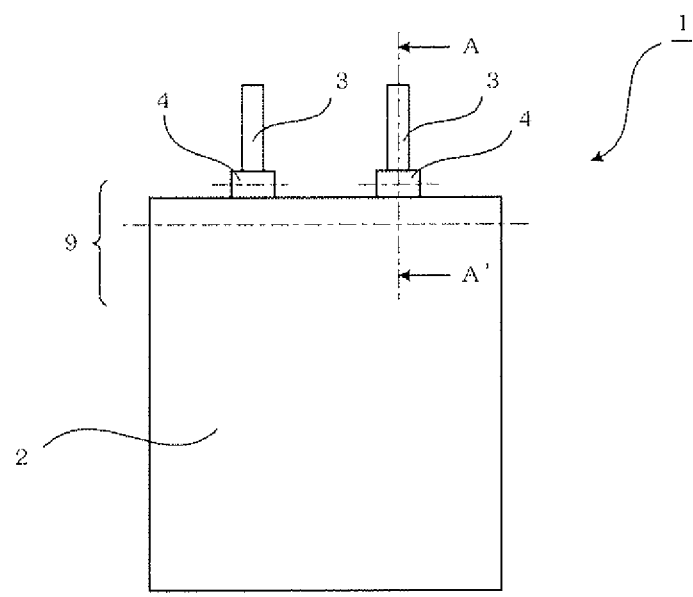
FIG. 1 is a front view of a nonaqueous electrolyte cell according to an embodiment of the present invention.
Figure 2:
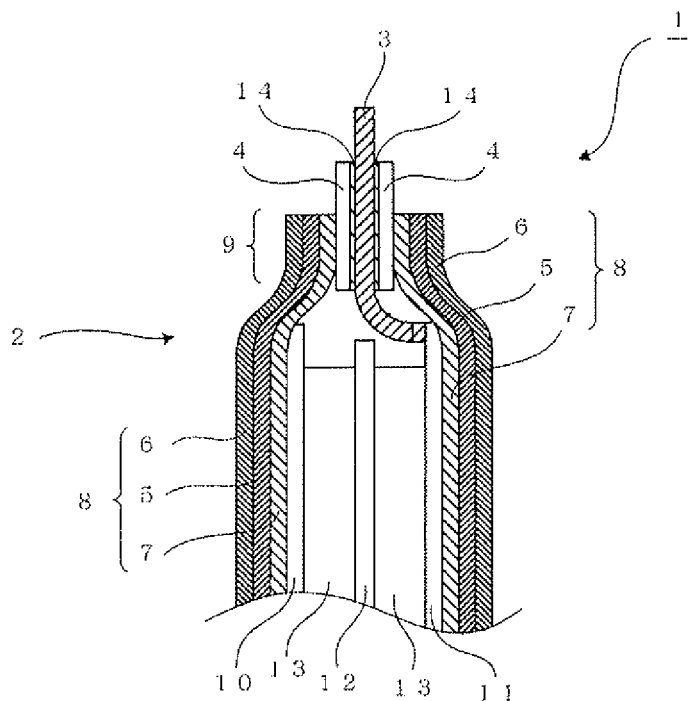
FIG. 2 is a partial cross-sectional view of a nonaqueous electrolyte cell according to an embodiment of the present invention.

The structure of an electrical part of the present invention will be described below with reference to the drawings. In the drawings, the same reference signs denote the same or corresponding portions, and a repeated description thereof will be omitted. Furthermore, dimensional ratios in the drawings do not always coincide with those in the description. FIG. 1 is a front view schematically showing a nonaqueous electrolyte cell, such as a lithium-ion battery, according to an embodiment, and FIG. 2 is a partial cross-sectional view taken along the line A-A' of FIG. 1. A nonaqueous electrolyte cell 1 includes a substantially rectangular sealable container 2 and lead conductors 3 extending from the inside to the outside of the sealable container 2.

As shown in FIG. 2, the sealable container 2 is composed of a three-layered laminate film 8 including a metal layer 5, and a resin layer 6 and a resin layer 7 which cover the metal layer 5. The metal layer 5 is composed of a metal, such as an aluminum foil. As the resin layer 6 located on the outer side of the sealable container, a polyamide resin, such as Nylon 6,6 or Nylon 6, a polyester resin, a polyimide resin, or the like can be used. Furthermore, as the resin layer 7 located on the inner side of the sealable container 2, an insulating resin which is not dissolved in a nonaqueous electrolyte and which is melted by heating is preferably used. Examples thereof include a polyolefin resin, an acid-modified polyolefin resin, and an acid-modified styrene elastomer. The sealable container 2 is formed by overlaying two laminate films 8, and heat-sealing three sides other than a side through which the lead conductors passes. In the outer periphery of the sealable container, two metal layers 5 are bonded together through the resin layers 7.

At a sealing portion 9, the lead conductor 3 is bonded (fusion-bonded) to the sealable container (laminate film 8) through a thermal adhesive layer 4. A layer 14 composed of a polyallylamine is provided at a part in contact with the lead conductor 3 on the inner side of the thermal adhesive layer 4.

A current collector for a positive electrode 10 and a current collector for a negative electrode 11 connected to the ends of the respective lead conductors, a nonaqueous electrolyte 13, and a separator 12 are further enclosed inside the nonaqueous electrolyte cell.

As a material constituting the thermal adhesive layer 4, it is possible to use any resin which is melted by heat during heat-sealing so that the sealable container and the lead conductor can be bonded together. For example, a polyolefin resin, an acid-modified polyolefin resin, an acid-modified styrene elastomer, or the like may be used, In addition to these resins, various additives, such as a flame retardant, an ultraviolet absorber, a light stabilizer, a heat stabilizer, a lubricant, and a coloring agent, can be mixed into the thermal adhesive layer. The resin material and additives are mixed using a known mixer, such as an open roll mixer, a pressure kneader, a single screw mixer, or a twin screw mixer, and then a film-shaped thermal adhesive layer is formed by extrusion forming or the like. The thickness of the thermal adhesive layer, which depends on the thickness of the lead conductor, is preferably 30 to 200 μm.

The thermal adhesive layer may also be crosslinked, before use, with ionizing radiation, such as accelerated electron beams or gamma rays. Heat resistance can be enhanced by crosslinking, and it is possible to prevent reduction in adhesiveness or short-circuiting between the lead conductor and the metal layer when the temperature during use is increased. The entire thermal adhesive layer may be crosslinked, or the thermal adhesive layer may be formed so as to have a multilayer structure in which a non-crosslinked layer and a crosslinked layer are stacked on each other.

The layer composed of a polyallylamine may be formed, for example, by applying a solution prepared by dissolving a polyallylamine in a solvent to the surface of the thermal adhesive layer, followed by drying. As the solvent, water, methanol, ethanol, propylene glycol monomethyl ether, or the like can be used. The layer composed of a polyallylamine preferably has a thickness of 10 nm to 0.1 μm.

A polyallylamine is a polymer obtained by polymerizing at least one type of allylamine. A homopolymer of allylamine, a homopolymer of diallylamine, a copolymer of allylamine and diallylamine, a copolymer of allylamine or diallylamine, sulfur dioxide, and maleic acid, or the like can be used as the polyallylamine. A polyallylamine having the amine moiety thereof neutralized, such as an acetate or a hydrochloride, can also be used.

Figure 3A:
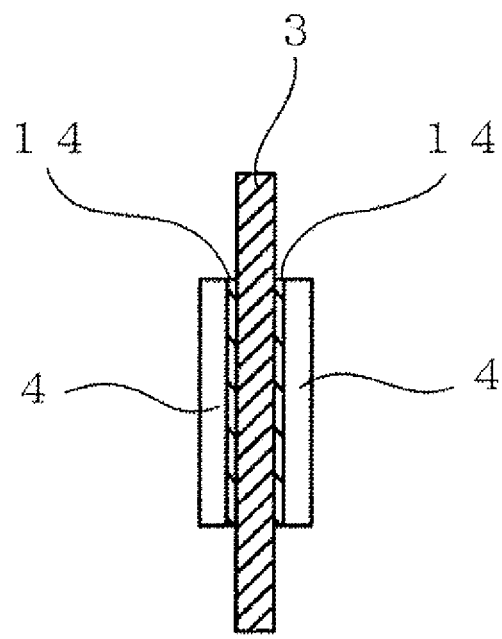
FIG. 3A is a partial cross-sectional view of a lead wire according to an embodiment of the present invention, in which a layer composed of a polyallylamine is provided only on the surface of a thermal adhesive layer.
Figure 3B:
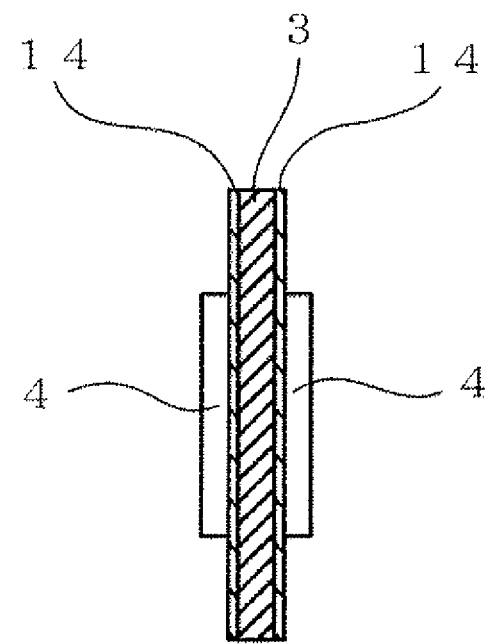
FIG. 3B is a partial cross-sectional view of a lead wire according to an embodiment of the present invention, in which a layer composed of a polyallylamine is provided so as to entirely cover a lead conductor.

The thermal adhesive layer 4 and the layer 14 composed of a polyallylamine may be provided in advance so as to cover a part corresponding to the sealing portion of the lead conductor 3. Such a structure is defined as a lead wire. FIGS. 3A and 3B are each a schematic cross-sectional view of a lead wire. Both surfaces of the lead wire are covered with a layer 14 composed of a polyallylamine and a thermal adhesive layer 4. The layer 14 composed of a polyallylamine may be provided only on the surface of the thermal adhesive layer as shown in FIG. 3A, or may be provided so as to entirely cover the lead conductor as shown in FIG. 3B. For example, a lead wire having the structure shown in FIG. 3A may be fabricated by forming a layer 14 composed of a polyallylamine by applying a polyallylamine solution onto the surface of a thermal adhesive layer 4, and bonding the resulting body to the lead conductor such that the layer composed of a polyallylamine is in contact with the lead conductor. Alternatively, a lead wire having the structure shown in FIG. 3A may be fabricated by forming a layer 14 composed of a polyallylamine by applying a polyallylamine solution onto the surface of a lead conductor, and then bonding a thermal adhesive layer thereto. Note that the lead wire may be referred to as the "tab lead" in some cases.

As the lead conductor 3, a metal, such as aluminum, nickel, copper, or nickel plated copper, is used. In the case of a lithium-ion battery, aluminum is used as a positive electrode, and nickel or nickel plated copper is used as a negative electrode in many cases.

Figure 4:
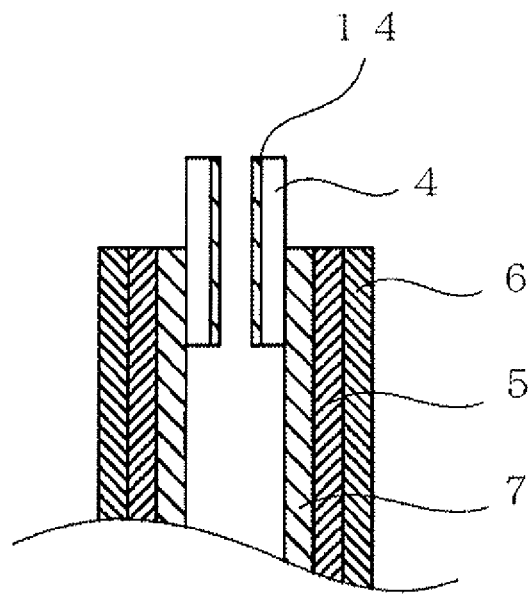
FIG. 4 is a partial cross-sectional view of a sealable container according to an embodiment of the present invention.
Figure 5:
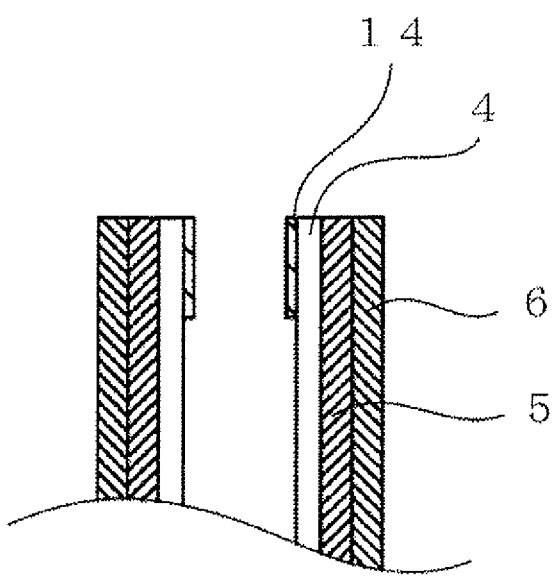
FIG. 5 is a partial cross-sectional view of a sealable container according to an embodiment of the present invention.
Figure 6:
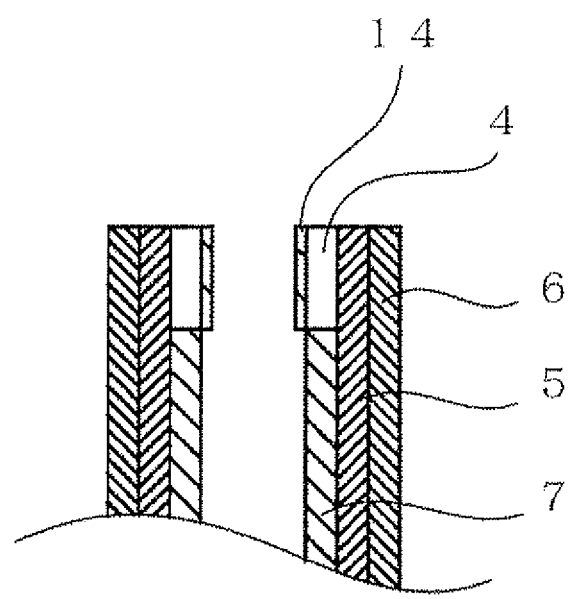
FIG. 6 is a partial cross-sectional view of a sealable container according to an embodiment of the present invention.

A thermal adhesive layer 4 and a layer 14 composed of a polyallylamine may be provided on a sealable container in advance. In this case, at least a part corresponding to a sealing portion of a laminate film is covered with a thermal adhesive layer 4, and a layer composed of a polyallylamine is provided on the surface of the thermal adhesive layer. Examples of such a sealable container include a configuration in which a thermal adhesive layer 4 and a layer 14 composed of a polyallylamine are provided on the inner side of a resin layer 7 (FIG. 4), a configuration in which an insulating resin layer 7 is entirely replaced with a thermal adhesive layer 4, and a layer composed of a polyallylamine is provided on the surface of the thermal adhesive layer at a part corresponding to the sealing portion (FIG. 5), and a configuration in which a part of an insulating resin layer 7 (a part corresponding to the sealing portion) is replaced with a thermal adhesive layer 4, and a layer composed of a polyallylamine is provided on the surface of the thermal adhesive layer 4 (FIG. 6). Furthermore, when the lead conductor and the sealable container are sealed (fusion-bonded) together, an adhesive member in which a layer composed of a polyallylamine is provided on the surface of a thermal adhesive layer may be inserted between the lead conductor and the sealable container.

In this embodiment, the lithium-ion battery has been described as an example. However, the electrical part and the nonaqueous electrolyte cell according to the present invention are not limited to this form.

EXAMPLES

The present invention will be described more in detail on the basis of examples. It is to be understood that the examples do not limit the scope of the present invention.

Examples 1 to 5

As each lead conductor for a negative electrode, a lead conductor composed of nickel plated copper with a thickness of 0.1 mm, a width of 20 mm, and a length of 40 mm was prepared. The lead conductor was immersed in the type of polyallylamine solution shown in Table I, followed by drying at 100° C. to form a layer composed of polyallylamine on the surface of the lead conductor. A thermal adhesive layer with a thickness of 100 μm was formed by extrusion forming of maleic anhydride-modified polypropylene. Both surfaces of the lead conductor were covered with the thermal adhesive layer, and bonding was performed by pressing at 180° C. for 5 seconds. Thereby, a lead wire was fabricated.

Examples 6 and 7

As each lead conductor for a negative electrode, a lead conductor composed of nickel plated copper with a thickness of 0.1 mm, a width of 20 mm, and a length of 40 mm was prepared. A thermal adhesive layer with a thickness of 100 μm was formed by extrusion forming of maleic anhydride-modified polypropylene. The type of polyallylamine solution shown in Table 1 was applied to the surface of the resulting thermal adhesive layer, followed by drying at 100° C. Thereby, an insulating film in which a layer composed of a polyallylamine was disposed on the surface of the thermal adhesive layer was obtained. Both surfaces of the lead conductor were covered with the insulating film such that the layer composed of a polyallylamine was in contact with the conductor, and bonding was performed by pressing at 180° C. for 5 seconds. Thereby, a lead wire was fabricated.

Comparative Example 1

As a lead conductor for a negative electrode, a lead conductor composed of nickel plated copper with a thickness of 0.1 mm, a width of 20 mm, and a length of 40 mm was prepared. A thermal adhesive layer with a thickness of 100 μm was formed by extrusion forming of maleic anhydride-modified polypropylene. Both surfaces of the lead conductor were covered with the thermal adhesive layer, and bonding was performed by pressing at 180° C. for 5 seconds. Thereby, a lead wire was fabricated.

Ethylene carbonate (EC), diethyl carbonate (DEC), and dimethyl carbonate (DMC) were mixed at a volume ratio of 1:1:1, and 1.0 mol/l of lithium hexafluorophosphate (LiPF$_6$) as an electrolyte was dissolved therein to prepare an electrolytic solution. The lead wires of Examples 1 to 7 and Comparative Example 1 were each immersed in the electrolytic solution, and with the moisture percentage in the electrolytic solution being adjusted to 100 to 200 ppm, left to stand in a constant temperature bath at 65° C. for two weeks and for four weeks. Then, occurrence of detachment between the thermal adhesive layer and the lead conductor was visually observed, and adhesiveness was evaluated by a 180° peeling test. The results are shown in Table 1. The term "materials fracture" means that adhesiveness was unmeasurable because the adhesiveness was very high and the peeled thermal adhesive layer was fractured.

TABLE I

| | Example 1 | Example 2 | Example 3 | Example 4 | Example 5 | Example 6 | Example 7 | Comparative Example |
|---|---|---|---|---|---|---|---|---|
| Solution | Treatment liquid 1 | Treatment liquid 2 | Treatment liquid 3 | Treatment liquid 4 | Treatment liquid 5 | Treatment liquid 1 | Treatment liquid 3 | Untreated |
| Treated object | Conductor | Conductor | Conductor | Conductor | Conductor | Thermal adhesive layer | Thermal adhesive layer | Thermal adhesive layer |
| Adhesiveness after 2 weeks (N/cm) | 16 | 8 | Materials fracture | 3 | 4 | 10 | 13 | — |
| Appearance after 2 weeks | ○ | ○ | ○ | ○ | ○ | ○ | ○ | x |
| Adhesiveness after 4 weeks (N/cm) | 5 | 8 | Materials fracture | 1 | 4 | 4 | 11 | — |
| Appearance after 4 weeks | ○ | ○ | ○ | ○ | ○ | ○ | ○ | x |

(Footnotes)
(*1) Allylamine polymer partially containing urea (PAA-N5000 manufactured by Nitto Boseki Co., Ltd.) Water/methanol solution (concentration 1.5%)
(*2) Diallylamine polymer (PAS-21 manufactured by Nitto Boseki Co., Ltd.) Water/propylene glycol monomethyl ether solution (concentration 2.5%)
(*3) Copolymer of diallylamine acetate and sulfur dioxide (PAS-92A manufactured by Nitto Boseki Co., Ltd.) Water/propylene glycol monomethyl ether solution (concentration 10%)
(*4) Allylamine polymer (PAA-03 manufactured by Nitto Boseki Co., Ltd.) Water/methanol solution (concentration 2%)
(*5) Diallyl dimethyl ammonium chloride copolymer (PAS-H-5L manufactured by Nitto Boseki Co., Ltd.) Water/methanol solution (concentration 3%)

In Examples 1 to 7 in which a layer composed of a polyallylamine was formed at a part in contact with the conductor, no detachment occurred even after being immersed in the electrolytic solution for four weeks, thus exhibiting good resistance to immersion in an electrolyte. In contrast, in Comparative Example 1 in which a polyallylamine was not used, detachment occurred about one week after being immersed in the electrolytic solution.

In Examples 3 and 7, the copolymer of diallylamine acetate and sulfur dioxide is used as the treatment liquid. In these examples, adhesiveness to the conductor, both after being immersed in the electrolytic solution for two weeks and after being immersed in the electrolytic solution for four weeks, is very high, and adhesiveness and resistance to an electrolyte are very good. Furthermore, compared with Example 4 in which the allylamine polymer is used as the treatment liquid, it is evident that, in Examples 1 to 3 and 5 to 7 in which other treatment liquids are used, both adhesiveness after two weeks and adhesiveness after four weeks are high, and adhesiveness and resistance to an electrolyte are high.

INDUSTRIAL APPLICABILITY

As described above, according to the present invention, it is possible to provide an electrical part, a nonaqueous electrolyte cell, and a lead wire and a sealable container which are used therein. The electrical part includes a sealable container having a metal layer, and a lead conductor extending from the inside to the outside of the sealable container, the sealable container and the lead conductor being fusion-bonded at a sealing portion, in which the sealing portion at least partially has a layer composed of a polyallylamine at a part between the metal layer and the lead conductor and in contact with the lead conductor, and therefore, adhesion and sealing properties can be enhanced in the initial state and in a state of being in contact with an electrolytic solution.

REFERENCE SIGNS LIST 1 nonaqueous electrolyte cell
2 sealable container
3 lead conductor
4 thermal adhesive layer
5 metal layer
6 resin layer
7 resin layer
8 laminate film
9 sealing portion
10 current collector for positive electrode
11 current collector for negative electrode
12 separator
13 nonaqueous electrolyte
14 layer composed of a polyallylamine

What is claimed is:
1. An electrical part comprising:
a sealable container defined by a multi-layer material having a metal layer, the sealable container having an interior space; and
a lead conductor extending from the interior space to outside of the sealable container, the sealable container and the lead conductor being fusion-bonded at a sealing portion, the sealing portion including a polyallylamine layer in direct contact with the lead conductor and being located between the metal layer and the lead conductor.

2. The electrical part according to claim 1, characterized in that the polyallylamine has sulfur dioxide in its molecular structure.

3. The electrical part according to claim 1, characterized in that the polyallylamine includes diallylamine as a polymerizable component.

4. A lead wire to be used in the electrical part according to claim 1, the lead wire comprising:
the lead conductor;
the polyallylamine layer directly contacting the lead conductor; and
a thermal adhesive layer which covers the polyallylamine layer at a part corresponding to at least the sealing portion of the lead conductor.

5. The lead wire according to claim 4, wherein the lead conductor is composed of nickel or a metal whose surface is plated with nickel.

6. A sealable container to be used in the electrical part according to claim 1, the sealable container comprising:
the metal layer;
the polyallylamine layer directly contacting the lead conductor; and
a thermal adhesive layer which covers the polyallylamine layer at a part corresponding to at least the sealing portion of the metal layer.

7. The electrical part according to claim 1, wherein the lead conductor is composed of nickel or a metal whose surface is plated with nickel.

8. A nonaqueous electrolyte cell comprising:
a sealable container defined by a multi-layer material having a metal layer, the sealable container having an interior space;
a lead conductor extending from the interior space to outside of the sealable container;
a nonaqueous electrolyte enclosed within the interior space of the sealable container; and
an electrode enclosed within the interior space of the sealable container and connected to an end of the lead conductor, the sealable container and the lead conductor being fusion-bonded at a sealing portion, the sealing portion including a polyallylamine layer in direct contact with the lead conductor and being located between the metal layer and the lead conductor.

9. A lead wire to be used in the nonaqueous electrolyte cell according to claim 8, the lead wire comprising:
the lead conductor;
the polyallylamine layer directly contacting the lead conductor; and
a thermal adhesive layer which covers the polyallylamine layer at a part corresponding to at least the sealing portion of the lead conductor.

10. The lead wire according to claim 9, wherein the lead conductor is composed of nickel or a metal whose surface is plated with nickel.

11. A sealable container to be used in the nonaqueous electrolyte cell according to claim 8, the sealable container comprising:
the metal layer;
the polyallylamine layer directly contacting the lead conductor; and
a thermal adhesive layer which covers the polyallylamine layer at a part corresponding to at least the sealing portion of the metal layer.

12. The nonaqueous electrolyte cell according to claim 8, wherein the lead conductor is composed of nickel or a metal whose surface is plated with nickel.

* * * * *